United States Patent [19]

Sosin

[11] Patent Number: 4,743,859

[45] Date of Patent: May 10, 1988

[54] AMPLIFYING CIRCUIT ARRANGEMENT HAVING MEANS FOR DISTORTION CORRECTION

[75] Inventor: Boleslaw M. Sosin, Chelmsford, United Kingdom

[73] Assignee: The Marconi Company Limited, Stanmore, England

[21] Appl. No.: 44,720

[22] Filed: May 1, 1987

[30] Foreign Application Priority Data

May 16, 1986 [GB] United Kingdom ......... 8611965

[51] Int. Cl.$^4$ ............................................. H03F 1/32
[52] U.S. Cl. ..................................... 330/54; 330/149; 330/151
[58] Field of Search .................. 330/54, 149, 151; 328/163; 455/50, 63

[56] References Cited

U.S. PATENT DOCUMENTS 4,359,695 11/1982 Gerard .......................... 330/149

Primary Examiner—James B. Mullins
Attorney, Agent, or Firm—Spencer & Frank

[57] ABSTRACT

A robust amplifier consists of two delay lines linked by a number of discrete amplifiers. Distortion correction is carried out by distortion feed forward. This is achieved by sampling the output of each amplifier at a coupler and then subtracting this sample from the input signal to later amplifiers along the delay line at directional coupler. As a result each discrete amplifier's distortion is corrected by all of the following discrete amplifiers in the amplifying circuit.

9 Claims, 2 Drawing Sheets

AMPLIFYING CIRCUIT ARRANGEMENT HAVING MEANS FOR DISTORTION CORRECTION

FIELD OF THE INVENTION

This invention concerns a circuit arrangement for the amplification of electrical signals.

DESCRIPTION OF THE PRIOR ART

To provide faithful amplification of an input signal it is desirable that the transfer characteristics of an amplifier should be linear. Unfortunately, all discrete amplifiers are imperfect, so all discrete amplifiers produce a distorted output. A major aim in the design of amplification circuits is to provide means to remove or reduce this distortion. The most common way of reducing distortion is application of negative feed-back, but another method is "distortion feed-forward", the principle of which will be described with reference to FIG. 1.

An input signal is split at a power divider 1, the proportion of the split depending on the particular design. The output of the power amplifier 2 is sampled at a coupler 3 and the sample is fed via an attenuator 4, to a coupler 5, where it is subtracted from the power fed directly from the divider 1, so that only the distortion signal of the amplifier 2 is fed to a further amplifier 7. The output of amplifier 7 is then combined with the output of power amplifier 2 at power combiner 8, where the distortion cancels. For proper operation the gains are adjusted as follows. The gain from input through divider 1, ampifier 2, coupler 3, attenuator 4 and coupler 5 to the input of amplifier 7 must equal the gain from the input through divider 1, delay line 6, coupler 5, to the input of amplifier 7. Also the gain from amplifier 2, coupler 3, attenuator 4, coupler 5, amplifier 7, combiner 8, to the output must equal the gain from amplifier 2, coupler 3, delay 9, combiner 8, to the output. Each power combiner and power divider is preferably a known four-terminal network having a matched load connected to its fourth port. The output of the power amplifier 2 is delayed before being fed into the combiner 8 by the delay 9, this delay is equal to the sum of the delays of attenuator 4 and amplifier 7 so that there is correlation between signals derived from the output of power amplifier 2 at the same instant, and distortion cancellation can occur.

As a result of this distortion feed-forward the amplification circuit has the same power output as the power amplifier 2 reduced by loss due to combiner 8, but only much smaller distortion due to imperfections in a practical circuit.

A problem with this arrangement is that any imbalance between the two input circuit arms, or mismatch at the output port can overload the amplifier 7 unless it is generously rated. Power handled by amplifier 7 does not of course, contribute to output power.

This problem can, particularly under multi-frequency operation, be solved by replacing the amplifier 7 with a power amplifier and so constructing a circuit arrangement capable of withstanding mismatching of its load, and rearranging power distribution so that amplifier 7 contributes fully to the useful power output of the circuit. Only a limited amount of distortion improvement is possible using this approach. Amplifiers with this capability will be referred to as robust in this specification.

In order to produce an amplification circuit with a high power handling capacity it is usually necessary to use a large number of discrete amplifiers.

BRIEF SUMMARY OF THE INVENTION

According to this invention an amplifying circuit arrangement includes a plurality of discrete amplifiers connected between successive points of an input delay line and corresponding points of an output delay line; the discrete amplifiers forming a series which is fed in order by a plurality of power dividers positioned along the input line so as to share the power of an input signal between the amplifiers, the outputs of the amplifiers being connected to said output line by a corresponding plurality of power combiners; means for separately sampling the output signals of each of a plurality of said amplifiers and utilising the sample signals for modifying the input signal on said input line and which is fed to subsequent amplifiers in said series so that the distortions of said sampled amplifiers are compensated by the subsequent amplifiers.

Figure 1:
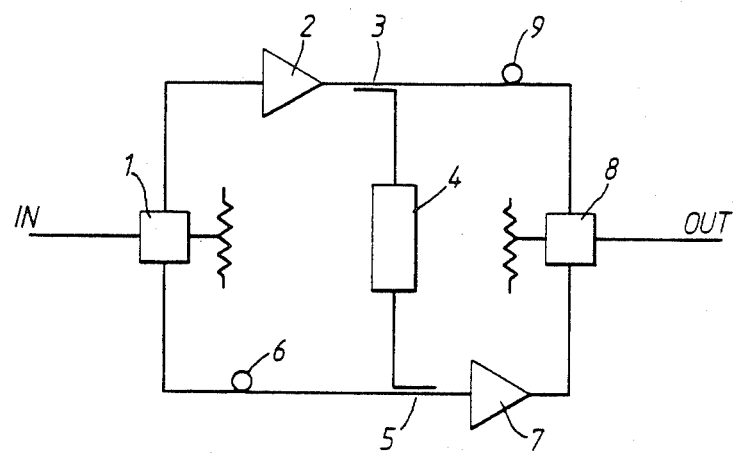
FIG. 1 shows a prior art amplifier which uses the "distortion feed-forward" method of reducing distortion.
Figure 2:
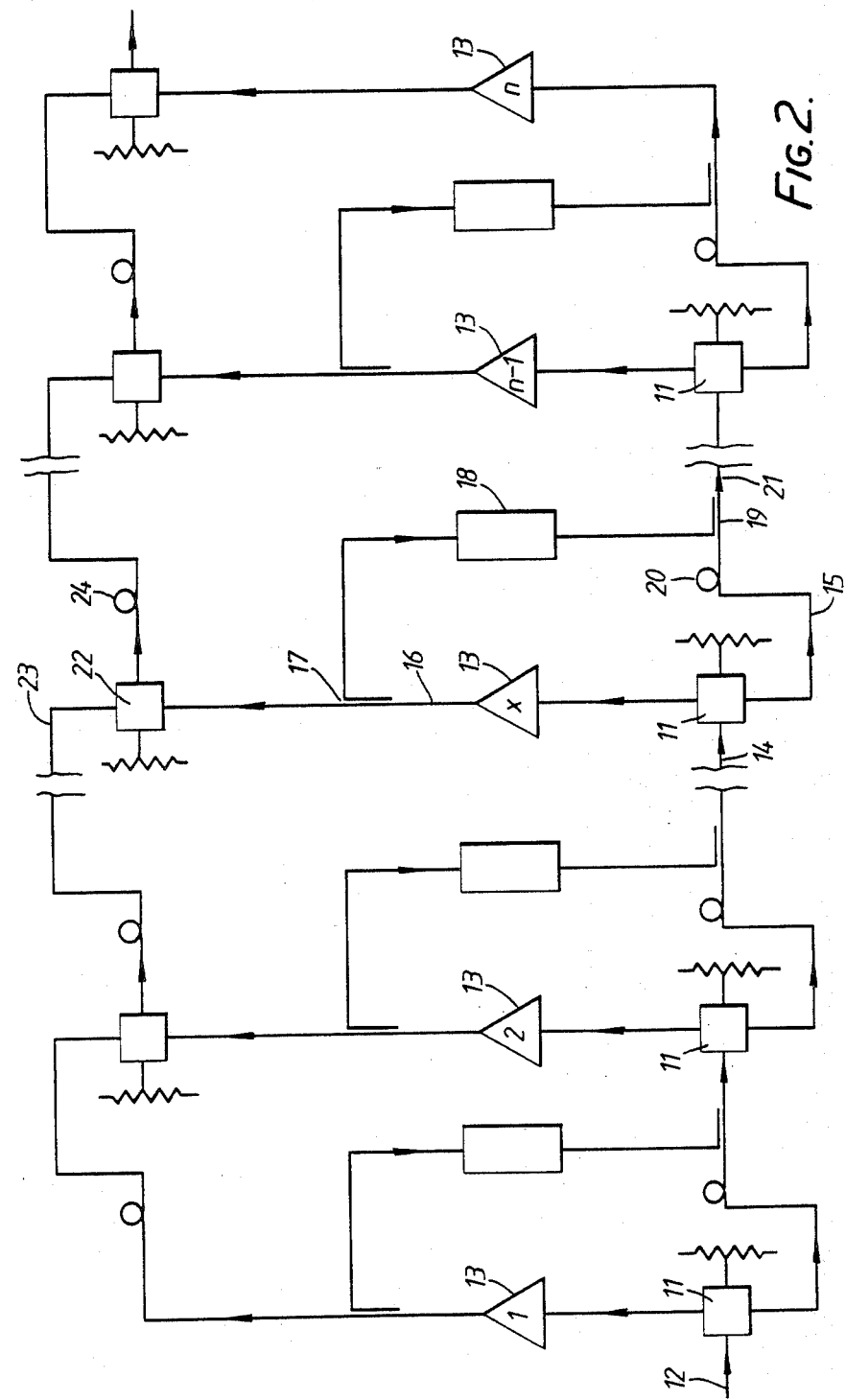

A preferred embodiment of the invention is shown by way of example with reference to FIG. 2.

DETAILED DESCRIPTION

FIG. 2 shows an amplification circuit made up of N discrete amplifiers, this circuit consists of N similar sections, so only one of these sections need be described in detail.

All components used in this circuit are known, and so they need not be described in detail.

The components 11 are asymmetric power dividers arranged so that when an input signal is applied to an input delay line at 12 an equal fraction of its power is applied to each of the discrete amplifiers 13.

In the section of the amplification circuit associated with discrete amplifier number X some part of the input signal arrives along an input line portion 14 and is split by an asymmetric power divider 11 such that a fraction as described above of the signal power is fed to a discrete amplifier 13 while the remainder is fed into an input line portion 15. The discrete amplifier 13 amplifies the signal fed to it and the output of the discrete amplifier 13 is on a line 16.

The signal on line 16 is sampled by a directional coupler 17. The coupler 17 supplies this sample signal via an attenuator 18, to a directional coupler 19 on the input delay line. In practice, the attenuator 18 will not be needed if the coupling factors of the couplers 12 and 19 are correctly adjusted. The injection path comprising the coupler 17, attenuator 18, and the coupler 19 therefore samples the output of each amplifier 13, and feeds the sample to a following point on the input delay line. The attenuation in the injection path is adjusted in such a way that the gain from an output of a sampled amplifier through the injection link, the combined gain of the following amplifiers, and the output delay line including output combiners, to the output port equals the gain from the output of the sampled amplifier to the output port. Because of the subtraction of the powers in the couplers 19, the power dividers 11 must be adjusted so as to distribute equal signal power to all amplifiers. Because amplifiers and couplers introduce signal delay, additional delays in the input and output lines have to be added to ensure that signals arrive at their destinations with the correct phase. Delay elements 20 and 24 provide this function.

The coupler 19 produces an output signal equal to the difference between its two inputs. This signal is fed by line 21 to the next section of the circuit.

The output of the discrete amplifier 13, after passing through the coupler 17, is combined at a power combiner 22 with the sum of the ouput of all the previous discrete amplifiers in the circuit, which is fed to the combiner 22 by the output delay line 23. The output of combiner 22 is put through the delay 24 before going on to be combined with the output of the next discrete amplifier in the circuit. Preferably all the discrete amplifiers have the same gain and delay.

The signal on input delay line 21 is used as input to all the later discrete amplifiers in the circuit, so the distortion correction signal for distortion due to discrete amplifier X is shared between them. Due to the arrangement of the delays at each combiner 22 combining the output of one discrete amplifier 13 with the sum of the outputs of the previous discrete amplifiers, both of these inputs to the combiner 22 will have been derived from the value of the input signal at the same instant and so the distortion due to each discrete amplifier will be corrected by all the following discrete amplifiers and the only remaining distortion will be due to the last discrete amplifier in the circuit. Thus the amplification circuit illustrated has the power capacity of N discrete amplifiers, but distortion theoretically equivalent to only 1/Nth of the distortion of the final discrete amplifier, as a portion of the distortion power will be absorbed in the load of the last combiner 22.

I claim:

1. An amplifying circuit arrangement including a plurality of discrete amplifiers connected between successive points of an input delay line and corresponding points of an output delay line; the discrete amplifiers forming a series which is fed in order by a plurality of power dividers positioned along the input line so as to share the power of an input signal between the amplifiers, the outputs of the amplifiers being connected to said output line by a corresponding plurality of power combiners; means for separately sampling the output signals of each of a plurality of said amplifiers and utilising the sampled signals for modifying the input signal on said input line and which is fed to subsequent amplifiers in said series so that the distortions of said sampled amplifiers are compensated by the subsequent amplifiers.

2. An arrangement as claimed in claim 1 and wherein means are provided for separately sampling the outputs of all of said amplifiers, except the last amplifier in said series, so as to provide compensation for distortions introduced by all of said amplifiers except the last amplifier.

3. An arrangement as claimed in claim 2 and wherein each of said plurality of discrte amplifiers has the same power handling capability, and the power dividers are arranged to route substantially the same proportion of the input power to each of the amplifiers.

4. An arrangement as claimed in claim 2 and wherein the means for separately sampling the output signal of an amplifier and utilising the sampled signals to modify the input signal fed to subsequent amplifiers in the series are arranged to attenuate the sampled signal such that all signal paths through the amplifying circuit arrangement have equal gain.

5. An arrangement as claimed in claim 2 and wherein each delay line comprises discrete delay elements connected between adjacent power combiners or power dividers, as the case may be.

6. An arrangement as claimed in claim 1 and wherein each of said plurality of discrete amplifiers has the same power handling capability, and the power dividers are arranged to route substantially the same proportion of the input power to each of the amplifiers.

7. An arrangement as claimed in claim 1 and wherein the means for separately sampling the output signal of an amplifier and utilising the sampled signals to modify the input signal fed to subsequent amplifiers in the series are arranged to attenuate the sampled signal such that all signal paths through the amplifying circuit arrangement have equal gain.

8. An arrangement as claimed in claim 7 and wherein each power divider has a first output which feeds one of said discrete amplifiers, and a second output which forms part of said input delay line, and wherein the signal on said delay line, which is arranged to combine with the attenuated sampled signal derived from that amplifier, is fed from said second output of the power divider such that the input signal fed via the input delay line to the next power divider is modified so as to take into account the distortions introduced by previous amplifiers in the series.

9. An arrangement as claimed in claim 1 and wherein each delay line comprises discrete delay elements connected between adjacent power combiners or power dividers, as the case may be.

* * * * *